(12) United States Patent
Fu et al.

(10) Patent No.: US 8,360,618 B2
(45) Date of Patent: Jan. 29, 2013

(54) LED UNIT

(75) Inventors: Ren-Tao Fu, Shenzhen (CN);
Chin-Chung Chen, Taipei Hsien (TW)

(73) Assignees: Fu Zhun Precision Industry (Shen Zhen) Co., Ltd., Shenzhen (CN);
Foxconn Technology Co., Ltd., New Taipei (TW)

( * ) Notice: Subject to any disclaimer, the term of this patent is extended or adjusted under 35 U.S.C. 154(b) by 327 days.

(21) Appl. No.: 12/788,313

(22) Filed: May 27, 2010

(65) Prior Publication Data
US 2011/0149580 A1   Jun. 23, 2011

(30) Foreign Application Priority Data
Dec. 21, 2009   (CN) .......................... 2009 1 0311914

(51) Int. Cl.
F21V 3/00 (2006.01)
G02B 23/24 (2006.01)

(52) U.S. Cl. .................. 362/311.02; 362/800; 362/268; 362/335; 359/362; 359/440; 359/648; 359/736

(58) Field of Classification Search ............ 362/311.02, 362/800, 612, 555, 268, 293, 326, 329, 334, 362/335; 359/355, 362, 365, 366, 385, 440, 359/800, 642, 648, 651, 674, 733, 736, 754, 359/794
See application file for complete search history.

(56) References Cited

U.S. PATENT DOCUMENTS

| 7,658,528 | B2* | 2/2010 | Hoelen et al. ................. 362/555 |
| 7,922,370 | B2* | 4/2011 | Zhang et al. ............. 362/311.02 |
| 2004/0190304 | A1* | 9/2004 | Sugimoto et al. ............ 362/555 |
| 2007/0019409 | A1* | 1/2007 | Nawashiro et al. ........... 362/231 |
| 2011/0090701 | A1* | 4/2011 | Zhang et al. ............. 362/311.02 |

* cited by examiner

Primary Examiner — Evan Dzierzynski
Assistant Examiner — Danielle Allen
(74) Attorney, Agent, or Firm — Altis Law Group, Inc.

(57) ABSTRACT

An LED unit includes a printed circuit board, an LED mounted on the printed circuit board, and a lens covering the LED and fixed on the printed circuit board. The lens includes a pedestal and an optical element connected to the pedestal. The lens has a light-incident face formed in an interior thereof for receiving light emitted from the LED into the lens, and a light-emergent face formed on an outside thereof for refracting the light out of the lens. The optical element has two opposite sides longer than the other two opposite sides thereof so that the light pattern modulated by the optical element has two opposite ends wider than a middle thereof.

17 Claims, 6 Drawing Sheets

LED UNIT

BACKGROUND

1. Technical Field

The present disclosure relates to a light emitting diode (LED) unit and, more particularly, to an LED unit having a lens which can produce a light pattern suitable for use in an indicating lamp.

2. Description of Related Art

LEDs, available since the early 1960's and because of their high light-emitting efficiency, have been increasingly used in a variety of occasions, such as residential, traffic, commercial, and industrial occasions. Conventional indicating lamps generally use multiple LEDs arranged along a side of a cover thereof so that the light emitted from the LEDs could radiate through symbols, letters or patterns on the cover to make the symbols, letters or patterns shine or glitter. However, the light emitted from the LEDs is highly directive that the symbols, letters or patterns on the cover cannot be uniformly illuminated, and the light-utilizing efficiency of the lamp is accordingly limited.

What is needed, therefore, is an LED unit which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
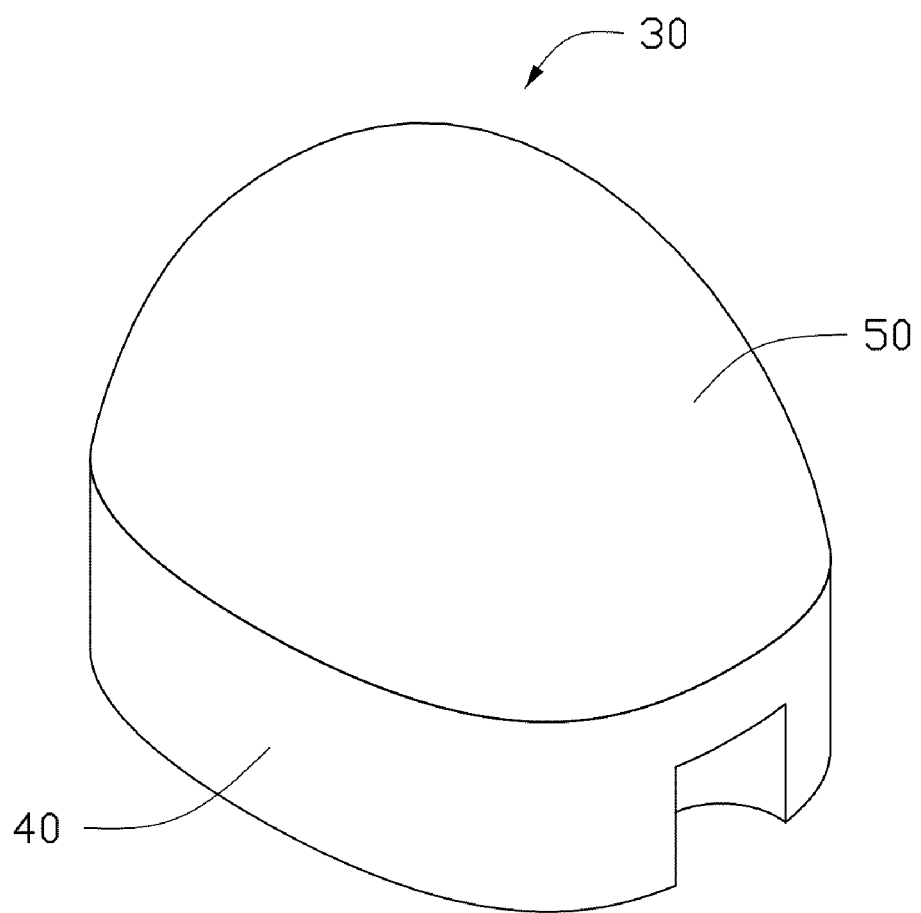
FIG. 1 is an isometric view of a lens of an LED unit of the disclosure.
Figure 5:
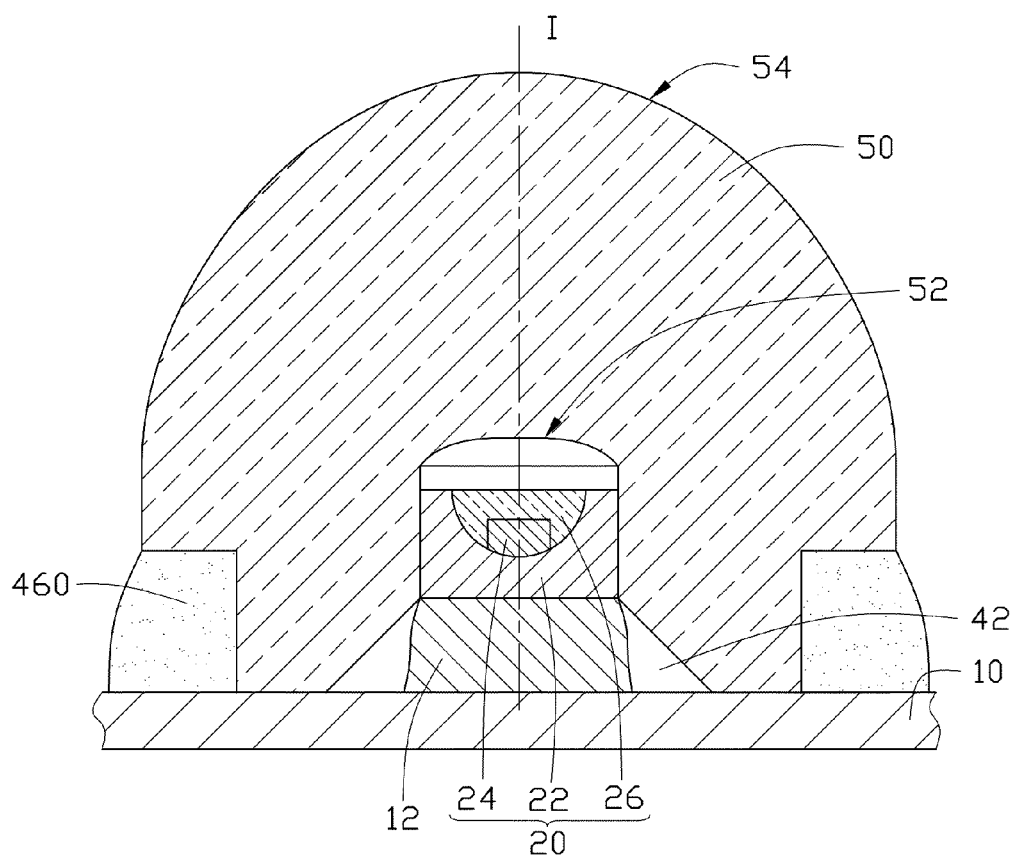
FIG. 5 shows another cross-section of the LED unit taken along plane a of FIG. 3.

Referring to FIGS. 1 and 5, an LED unit of the present disclosure is illustrated. The LED unit includes a printed circuit board 10, an LED 20 mounted on the printed circuit board 10 and a lens 30 covering the LED 20 and placed on the printed circuit board 10. The printed circuit board 10 may be a metal core printed circuit board (MCPCB), a ceramic printed circuit board (CPCB) or other suitable printed circuit boards having good heat-conducting capabilities. The printed circuit board 10 supplies electricity into the LED 20 for powering the LED 20 to lighten. The LED 20 includes a bowl-shaped base 22, an LED die 24 fixed in the base 22, and an encapsulant 26 covering the LED die 24. The base 22 may be made of plastic or epoxy for insulating the LED die 24 from the printed circuit board 10. Alternatively, the base 22 can also be made of ceramic for further promoting heat conduction from the LED die 24 to the printed circuit board 10. A cavity (not labeled) is defined in a top of the base 22 for receiving the LED die 24 and the encapsulant 26. The LED die 24 may be a GaN die, a ZnS die, a ZnSe die or other type dies which could emit light with a desirable color. The encapsulant 26 fills the cavity in the base 22 and substantially envelopes the LED die 24 therein. The encapsulant 26 is made of transparent materials such as silicon, epoxy or glass. Phosphors may be doped within the encapsulant 26 for changing the color of the light emitted from the LED die 24. The encapsulant 26 has a top face coplanar with the top of the base 22. The LED 20 has an optical axis I around which the light emitted out of the LED 20 is symmetrically distributed. The LED 20 is fixed to the printed circuit board 10 by solder 12 which also acts as a heat conductor to transfer heat from the LED 20 to the printed circuit board 10.

Figure 2:
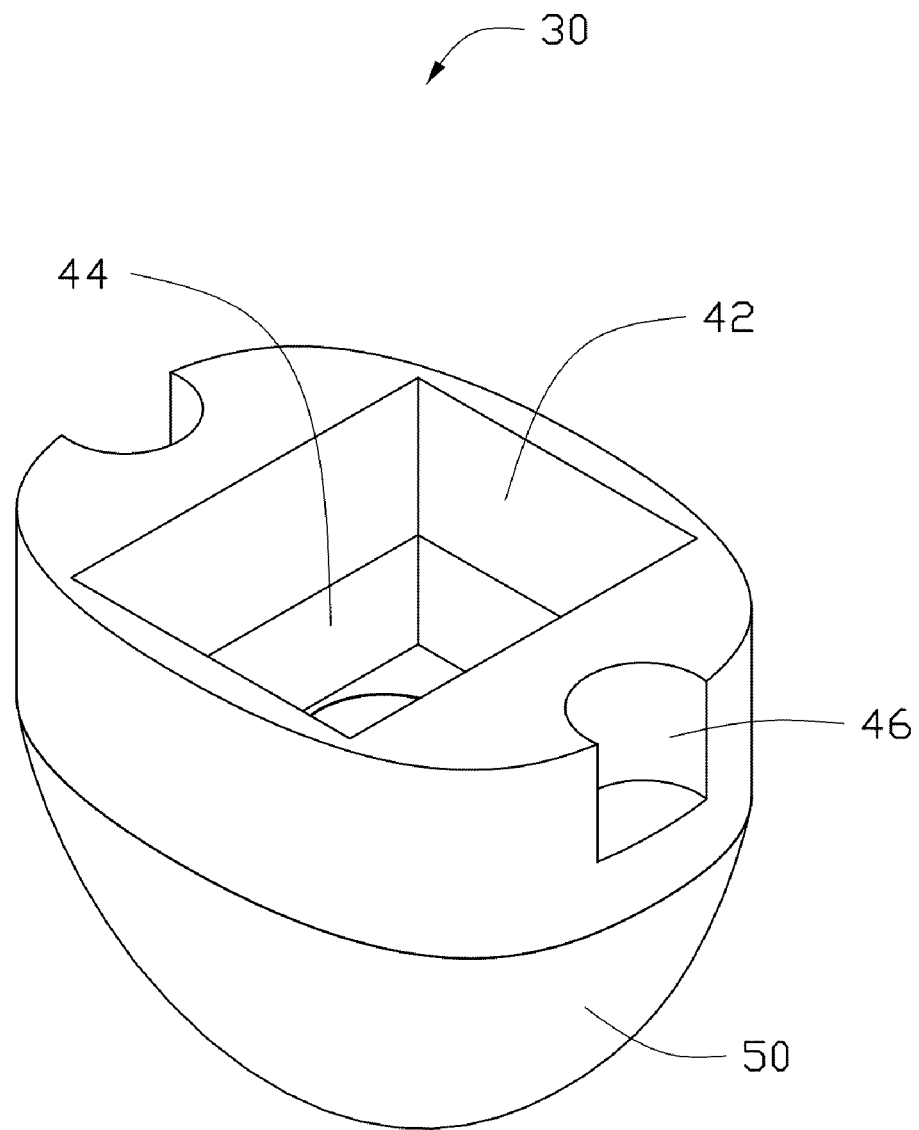
FIG. 2 is an inverted view of the lens of FIG. 1.
Figure 3:
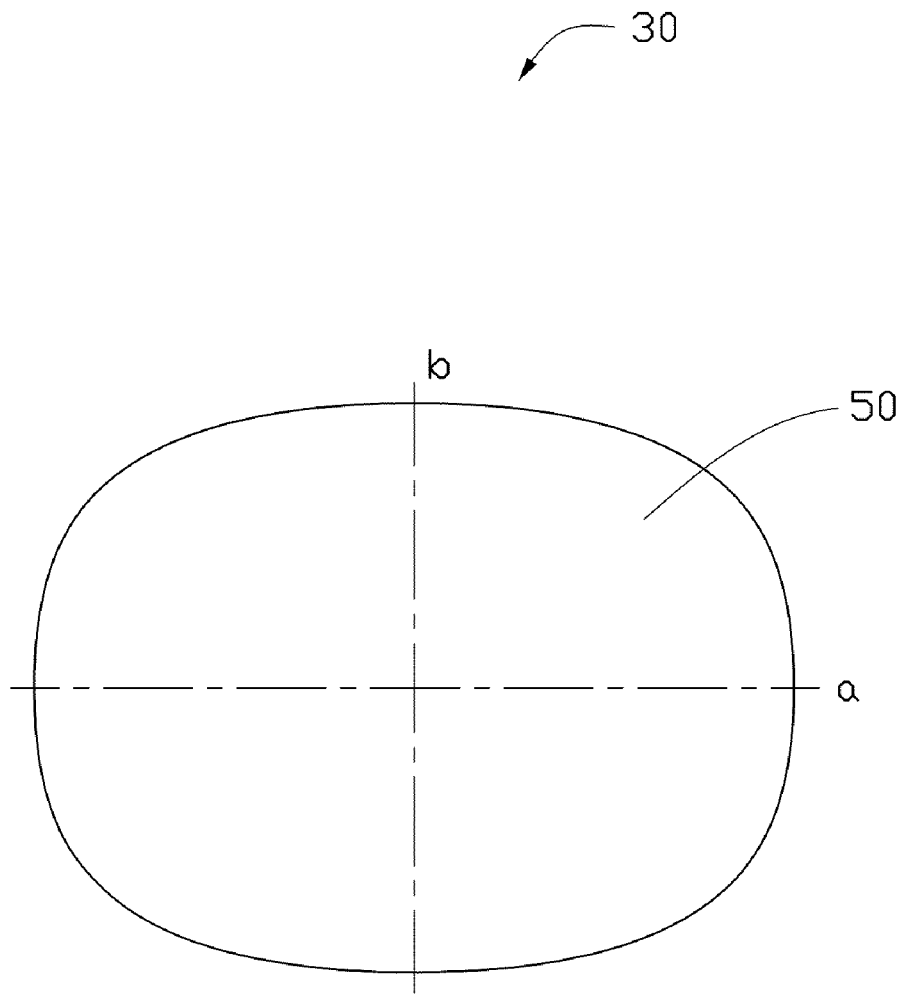
FIG. 3 shows a top of the lens of FIG. 1.
Figure 4:
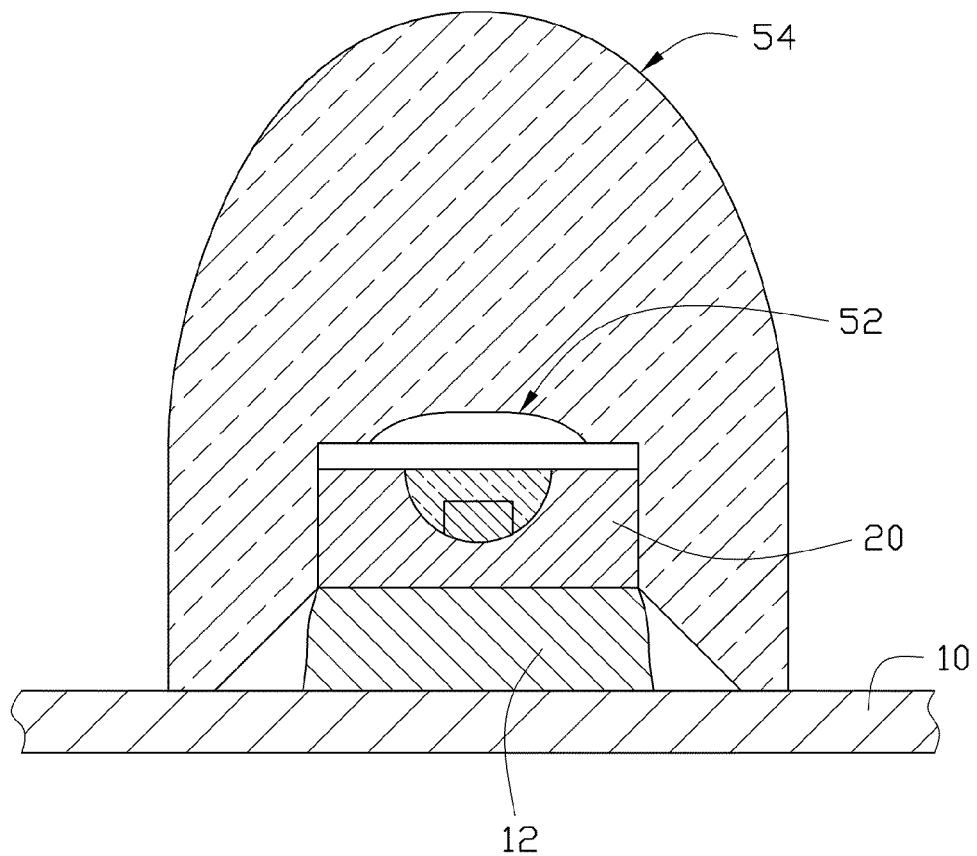
FIG. 4 shows a cross-section of the LED unit taken along plane b of FIG. 3, wherein a printed circuit board with an LED mounted thereon is placed below the lens.

Also referring to FIGS. 2-4, the lens 30 is made of transparent materials such as PC (Polycarbonate) or PMMA (Polymethylmethacrylate). The lens 30 includes a column-shaped pedestal 40 and a dome-shaped optical element 50 connected to the pedestal 40. The pedestal 40 has an opening 42 defined in a bottom face thereof. The opening 42 is shaped like a truncated pyramid which gradually expands along a top-to-bottom direction. The opening 42 receives the solder 12 therein. A chamber 44 is defined in the lens 30 and located above the opening 42 and communicates with the opening 42. The chamber 44 extends through the pedestal 40 into the optical element 50. An inner face of the lens 30 defining a top of the chamber 44 forms a curved light-incident face 52 of the lens 30, through which the light emitted from the LED 20 enters the lens 30. The LED 20 is spaced from the light-incident face 52 by an air gap. A pair of cutouts 46 are defined in two opposite sides of the pedestal 40, wherein each cutout 46 extends through the bottom face of the pedestal 40 to receive glue 460 therein, which is used for adhesively attaching the lens 30 on the printed circuit board 10.

The optical element 50 has a diameter gradually decreasing along a bottom-to-top direction. A periphery of the optical element 50 has a shape similar to an ellipse which has two opposite sides longer than the other two opposite sides, when viewed from a top of the lens 30 as shown in FIG. 3. An outer face of the optical element 50 forms a curved light-emergent face 54 of the lens 30, through which the light within the optical element 50 radiates out of the lens 30. The light-emergent face 54 has an area larger than that of the light-incident face 52.

Figure 6:
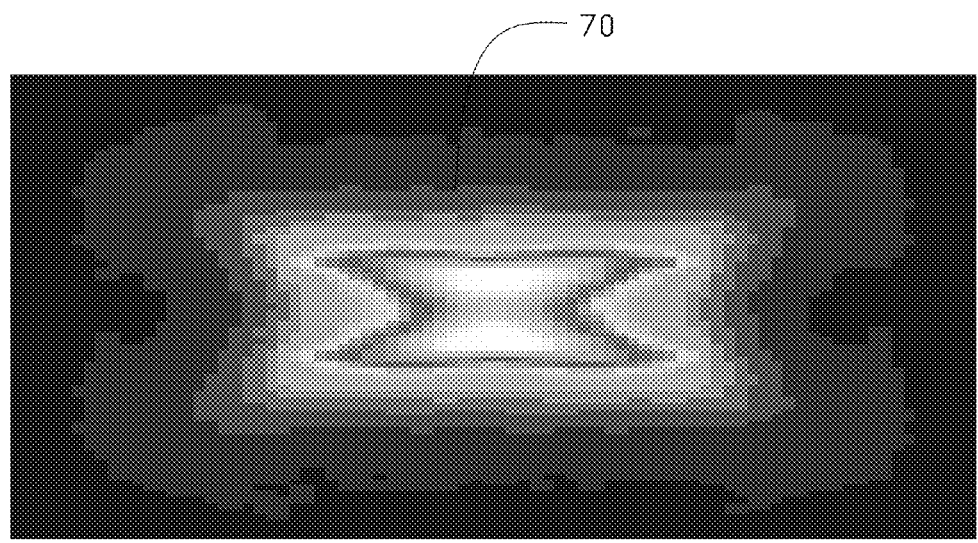
FIG. 6 shows a light pattern produced by the LED unit.

FIG. 6 shows a light pattern 70 of the LED unit which is formed on a screen distantly placed in front of the top of the lens 30. The light pattern has a shape similar to a sandglass wherein two opposite ends of the light pattern 70 is much wider than a middle thereof. Preferably, the width of each end of the light pattern 70 is 2.5 times as that of the middle of the light pattern 70. The light emitted from the LED 20 is adjusted by the lens 30 so that one of the wide ends of the light pattern 70 is at a place where a cover of an indicating lamp is placed, and the narrow middle thereof is at a place where the LED 20 is mounted. The LED 20 is parallel to the cover and within the indicating lamp. Therefore, the cover which requires a large amount of light to shine the symbols, letters or patterns thereof, is uniformly illuminated by the wide end of the light pattern 70, and light-utilizing efficiency of the indicating lamp is accordingly raised due to an interior of the lamp where the LED 20 is mounted, is prevented from being given too much light. Furthermore, since the two opposite ends of the light pattern 70 have the same width, that is to say, a backplate of the indicating lamp opposite to the cover is also illuminated with the large amount of light as the cover, the backplate can be replaced with another cover which also have required symbols, letters or patterns thereon, to thereby construct an indicating lamp with a double-sided shining feature.

Furthermore, curvatures of the lens 30 can be particularly designed to modulate the light pattern 70 outputted from the lens 30 more favorably. For example, the curvature of the light-incident face 52 in both of planes a and b which are perpendicularly crossed at the optical axis I, ranges between 0.1~2.4 mm$^{-1}$; the curvature of the light-emergent face 54 ranges between 0.1~0.4 mm$^{-1}$ in the plane a as viewed from FIG. 5, and ranges between 0.1~0.5 mm$^{-1}$ in the plane b as viewed from FIG. 4; the curvature of the periphery of the optical element 50 ranges between 0~0.6 mm$^{-1}$ as viewed from FIG. 3.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A light emitting diode unit comprising:
   a light emitting diode; and
   a lens receiving the light emitting diode therein;
   wherein the lens comprises two opposite long sides and two opposite short sides connected to the two opposite long sides;
   wherein light emitted from the light emitting diode is refracted by the two opposite long sides and the two opposite short sides of the lens to produce a light pattern which has two opposite ends wider than a middle thereof; and
   wherein the lens comprises a pedestal and an optical element coupled to the pedestal, the optical element having a diameter gradually decreasing in a direction from the pedestal toward an end of the optical element remote from the pedestal.

2. The light emitting diode unit as claimed in claim 1, wherein a periphery of the optical element viewed from a top of the lens has a curvature ranging between 0~0.6 mm$^{-1}$, the optical element being located above the pedestal and having a top face as a top face of the lens.

3. The light emitting diode unit as claimed in claim 1, wherein the lens comprises a light-incident face formed in an interior thereof, the light-incident face facing the light emitting diode.

4. The light emitting diode unit as claimed in claim 3, wherein the light-incident face has a curvature ranging between 0.1~2.4 mm$^{-1}$.

5. The light emitting diode unit as claimed in claim 1, wherein the lens comprises a light-emergent face formed on an outside of the optical element, the light-emergent face having an area larger than that of the light-incident face.

6. The light emitting diode unit as claimed in claim 5, wherein the light-emergent face has a curvature ranging between 0.1~0.5 mm$^{-1}$ in a cross-section of the lens.

7. The light emitting diode unit as claimed in claim 6, wherein the light-emergent face has a curvature ranging between 0.1~0.4 mm$^{-1}$ in another cross-section perpendicular to the cross-section of the lens.

8. The light emitting diode unit as claimed in claim 1 further comprising a printed circuit board supporting the light emitting diode thereon, wherein the light emitting diode is electrically connected to the printed circuit board.

9. The light emitting diode unit as claimed in claim 8, wherein the pedestal defines an opening in a bottom thereof to receive solder therein, the solder connecting the light emitting diode with the printed circuit board.

10. The light emitting diode unit as claimed in claim 9, wherein the opening has a diameter gradually decreasing in a direction away from the printed circuit board toward the optical element of the lens.

11. The light emitting diode unit as claimed in claim 9, wherein the lens defines a chamber communicating with the opening to receive the light emitting diode therein.

12. The light emitting diode unit as claimed in claim 8, wherein the lens defines a pair of cutouts at two opposite sides of the pedestal thereof, the light emitting diode being located between the pair of cutouts.

13. The light emitting diode unit as claimed in claim 12, wherein each of the pair of cutouts is filled with glue to adhesively attach the lens on the printed circuit board.

14. The light emitting diode unit as claimed in claim 12, wherein the pair of cutouts are located below the optical element.

15. The light emitting diode unit as claimed in claim 1, wherein each end of the light pattern has a width twice more than that of the middle of the light pattern.

16. The light emitting diode unit as claimed in claim 1, wherein the light pattern has a shape approximate to a sandglass.

17. The light emitting diode unit as claimed in claim 1, wherein the periphery of the optical element has a shape approximate to an ellipse when view from a top of the lens.

* * * * *